United States Patent
Gibson et al.

(10) Patent No.: US 9,297,843 B2
(45) Date of Patent: Mar. 29, 2016

(54) FAULT DIAGNOSTIC SYSTEMS AND METHODS USING OXYGEN SENSOR IMPEDANCE

(71) Applicant: GM Global Technology Operations LLC, Detroit, MI (US)

(72) Inventors: Bradley C. Gibson, Swartz Creek, MI (US); Eric M. Hall, Rochester Hills, MI (US); John W. Siekkinen, Novi, MI (US); Stephen Paul Levijoki, Swartz Creek, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 386 days.

(21) Appl. No.: 13/832,263

(22) Filed: Mar. 15, 2013

(65) Prior Publication Data

US 2014/0278013 A1 Sep. 18, 2014

(51) Int. Cl.
*F02D 41/14* (2006.01)
*G01R 27/02* (2006.01)
*F01N 11/00* (2006.01)

(52) U.S. Cl.
CPC ............ *G01R 27/02* (2013.01); *F02D 41/1456* (2013.01); *F02D 41/1494* (2013.01); *F02D 41/1495* (2013.01); *F01N 11/007* (2013.01); *F01N 2560/025* (2013.01); *F02D 41/1441* (2013.01); *F02D 41/1455* (2013.01)

(58) Field of Classification Search
CPC . F01N 11/007; F01N 9/007; F01N 2560/025; F02D 41/1495; F02D 41/1456; F02D 41/1441; F02D 41/1445; F02D 41/1455; F02D 41/1454; F02D 41/1494; G01R 27/02
USPC ........... 123/684, 690, 688; 324/514; 701/108; 204/401, 427, 400; 73/114.69, 114.75, 73/23.32, 114.76, 114.72
See application file for complete search history.

(56) References Cited

U.S. PATENT DOCUMENTS

| | | | | |
|---|---|---|---|---|
| 4,182,300 | A | * | 1/1980 | Ono et al. ................. 123/198 D |
| 4,472,262 | A | * | 9/1984 | Kondo et al. ................. 204/408 |
| 5,245,979 | A | * | 9/1993 | Pursifull et al. ............. 123/690 |
| 5,709,198 | A | * | 1/1998 | Sagisaka et al. ............. 123/684 |
| 5,811,661 | A | * | 9/1998 | Scheid et al. ................ 73/23.32 |

(Continued)

*Primary Examiner* — Lindsay Low
*Assistant Examiner* — George Jin

(57) ABSTRACT

A diagnostic system of a vehicle includes an impedance module and a diagnostic module. The impedance module determines an impedance of a sensing element of an exhaust gas oxygen sensor based on a response of the sensing element to a change in current through the sensing element. The diagnostic module selectively diagnoses a fault associated with the exhaust gas oxygen sensor based on the impedance of the sensing element.

16 Claims, 3 Drawing Sheets

(56) References Cited

U.S. PATENT DOCUMENTS

| | | | |
|---|---|---|---|
| 6,205,989 B1* | 3/2001 | Aoki | 123/688 |
| 6,286,493 B1* | 9/2001 | Aoki | 123/690 |
| 6,343,499 B1* | 2/2002 | Inagaki et al. | 73/23.32 |
| 6,382,015 B1* | 5/2002 | Aoki | 73/23.32 |
| 6,789,533 B1* | 9/2004 | Hashimoto et al. | 123/672 |
| 7,293,557 B2* | 11/2007 | Nakamura et al. | 123/688 |
| 7,523,653 B2* | 4/2009 | Smith et al. | 73/114.69 |
| 7,934,420 B2* | 5/2011 | Kama et al. | 73/114.69 |
| 2003/0151416 A1* | 8/2003 | Bolz | 324/651 |
| 2004/0025856 A1* | 2/2004 | Iida et al. | 123/688 |
| 2004/0099528 A1* | 5/2004 | Hattori | 204/401 |
| 2004/0100271 A1* | 5/2004 | Ikeda | 324/514 |
| 2005/0131601 A1* | 6/2005 | Kunihiro et al. | 701/34 |
| 2007/0045112 A1* | 3/2007 | Tashiro | 204/401 |
| 2008/0116071 A1* | 5/2008 | Nakamura et al. | 204/427 |
| 2008/0195873 A1* | 8/2008 | Nair | 713/300 |
| 2008/0232015 A1* | 9/2008 | Wakabayashi et al. | 361/79 |
| 2009/0319085 A1* | 12/2009 | Sell | F02D 41/1494 700/275 |
| 2013/0291630 A1* | 11/2013 | Takagi et al. | 73/114.75 |

* cited by examiner

FAULT DIAGNOSTIC SYSTEMS AND METHODS USING OXYGEN SENSOR IMPEDANCE

FIELD

The present application relates to internal combustion engines and more particularly to oxygen sensors.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

An engine combusts air and fuel within cylinders to generate torque. A fuel system injects fuel for the engine. A control module controls the fuel system to control fuel injection amount and timing. The control module selectively adjusts the amount of fuel provided to the engine based on signals from an exhaust gas oxygen (EGO) sensor located upstream from a catalyst in an exhaust system. The control module also selectively adjusts the amount of fuel provided to the engine based on signals from an EGO sensor located downstream from the catalyst.

For example only, when the upstream EGO sensor indicates that the exhaust is (fuel) rich, the control module may decrease the amount of fuel provided to the engine. Conversely, the control module may increase the amount of fuel provided to the engine when the exhaust is lean. Adjusting the amount of fuel provided to the engine based on the signals from the EGO sensors may, for example, modulate the air/fuel mixture combusted within the engine at approximately a desired air/fuel mixture (e.g., a stoichiometric mixture).

SUMMARY

In a feature, a diagnostic system of a vehicle includes an impedance module and a diagnostic module. The impedance module determines an impedance of a sensing element of an exhaust gas oxygen sensor based on a response of the sensing element to a change in current through the sensing element. The diagnostic module selectively diagnoses a fault associated with the exhaust gas oxygen sensor based on the impedance of the sensing element.

In further features, the diagnostic system further includes a monitoring module that illuminates a lamp when the fault is diagnosed.

In yet further features, a fuel control module selectively adjusts fueling of an engine based on an output of the exhaust gas oxygen sensor.

In still further features, the impedance module determines the impedance of the sensing element based on the change in current through the sensing element, a first value of a voltage output of the sensing element before the change, a second value of the voltage output of the sensing element after the change.

In further features, the impedance module determines the impedance of the sensing element based on the change and a difference between the first and second values.

In yet further features, the impedance module sets a third value equal to the second value minus the first value and determines the impedance of the sensing element based on the third value divided by the change.

In still further features, the diagnostic module diagnoses the fault when the impedance is greater than a predetermined value.

In further features, the diagnostic module diagnoses the fault when the impedance is less than a predetermined value.

In yet further features: the impedance module determines Y values of the impedance of the sensing element based on Y responses of the sensing element to Y changes in current through the sensing element, respectively; Y is an integer greater than one; and the diagnostic module selectively diagnoses the fault based on the Y values of the impedance.

In still further features, the diagnostic module diagnoses the fault when at least X out of the Y values of the impedance are one of greater than a first predetermined value and less than a second predetermined value. X is an integer greater than zero, and X is one of less than and equal to Y.

In a feature, a diagnostic method for a vehicle is disclosed. The diagnostic method includes: determining an impedance of a sensing element of an exhaust gas oxygen sensor based on a response of the sensing element to a change in current through the sensing element; and selectively diagnosing a fault associated with the exhaust gas oxygen sensor based on the impedance of the sensing element.

In further features, the diagnostic method further includes illuminating a lamp when the fault is diagnosed.

In yet further features, the diagnostic method further includes selectively adjusting fueling of an engine based on an output of the exhaust gas oxygen sensor.

In still further features, the diagnostic method further includes determining the impedance of the sensing element based on the change in current through the sensing element, a first value of a voltage output of the sensing element before the change, a second value of the voltage output of the sensing element after the change.

In further features, the diagnostic method further includes determining the impedance of the sensing element based on the change and a difference between the first and second values.

In yet further features, the diagnostic method further includes: setting a third value equal to the second value minus the first value; and determining the impedance of the sensing element based on the third value divided by the change.

In still further features, the diagnostic method further includes diagnosing the fault when the impedance is greater than a predetermined value.

In further features, the diagnostic method further includes diagnosing the fault when the impedance is less than a predetermined value.

In yet further features, the diagnostic method further includes: determining Y values of the impedance of the sensing element based on Y responses of the sensing element to Y changes in current through the sensing element, respectively, wherein Y is an integer greater than one; and selectively diagnosing the fault based on the Y values of the impedance.

In still further features, the diagnostic method further includes diagnosing the fault when at least X out of the Y values of the impedance are one of greater than a first predetermined value and less than a second predetermined value. X is an integer greater than zero, and X is one of less than and equal to Y.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

An engine produces exhaust (gas) and outputs the exhaust to an exhaust system. The exhaust travels through the exhaust system to a catalyst. A first exhaust gas oxygen (EGO) sensor measures oxygen in the exhaust upstream of the catalyst and generates an output based on the measured oxygen. A second EGO sensor measures oxygen in the exhaust downstream of the catalyst and generates an output based on the measured oxygen.

An engine control module (ECM) controls an amount of fuel provided to the engine. The ECM may selectively adjust the amount of fuel provided to the engine based on the amount of oxygen upstream of the catalyst measured by the first EGO sensor. The ECM may also selectively adjust the amount of fuel provided to the engine based on the amount of oxygen downstream of the catalyst measured by the second EGO sensor.

The ECM of the present disclosure selectively changes current flow through a sensor element of an EGO sensor, such as the first EGO sensor or the second EGO sensor. Based on a response of an output of the EGO sensor to the change in current, the ECM determines an impedance of the sensor element of the EGO sensor. The ECM determines whether a fault is present based on the impedance of the sensor element. For example, based on the impedance of the sensor element, the ECM may determine whether an open circuit fault is present, a short to ground fault is present, and/or a short to power fault is present.

Figure 1:
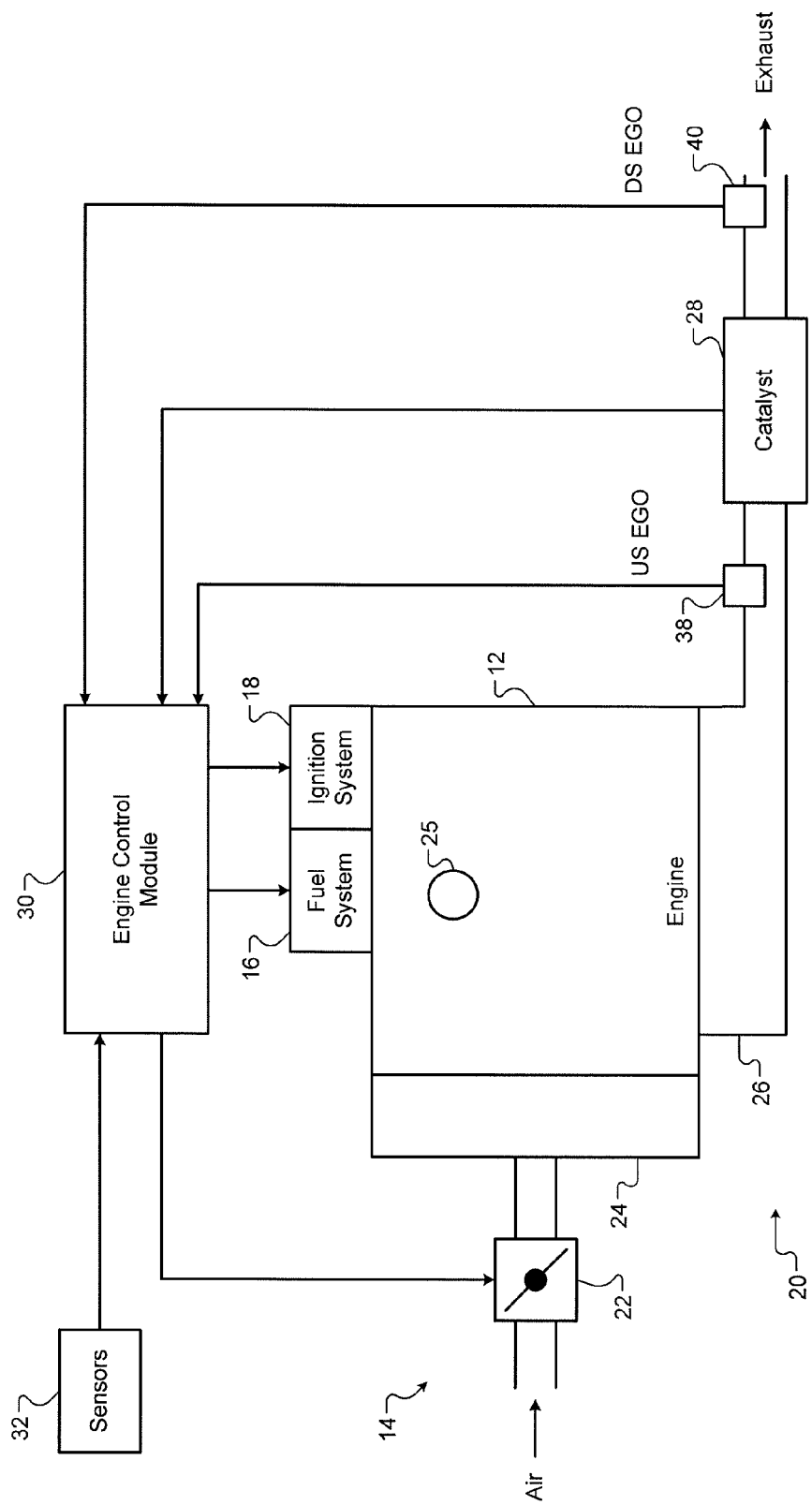
FIG. 1 is a functional block diagram of an example engine system according to the present disclosure.

Referring now to FIG. 1, a functional block diagram of an example engine system is presented. The engine system includes an engine 12, an intake system 14, a fuel system 16, an ignition system 18, and an exhaust system 20. The intake system 14 may include a throttle valve 22 and an intake manifold 24. The throttle valve 22 controls air flow into the intake manifold 24. Air flows from the intake manifold 24 into one or more cylinders within the engine 12, such as cylinder 25. While only the cylinder 25 is shown, the engine 12 may include more than one cylinder.

The fuel system 16 controls injection of fuel into the engine 12. For example, fuel may be injected directly into the cylinders of the engine 12. The ignition system 18 selectively ignites an air/fuel mixture within the cylinders of the engine 12 using spark. While spark ignition is shown and discussed, the present disclosure is also applicable to compression ignition engines and other types of engines. The air of the air/fuel mixture is provided via the intake system 14, and the fuel of the air/fuel mixture is provided by the fuel system 16.

Exhaust resulting from combustion of the air/fuel mixture is expelled from the engine 12 to the exhaust system 20. The exhaust system 20 includes an exhaust manifold 26 and a catalyst 28. For example only, the catalyst 28 may include a three-way catalyst (TWC) and/or another suitable type of catalyst. The catalyst 28 receives the exhaust output by the engine 12 and reacts with various components of the exhaust. The exhaust system 20 may also include an air pump that pumps ambient air into the exhaust system 20 upstream of the catalyst 28.

An engine control module (ECM) 30 regulates operation of the engine system. The ECM 30 controls the intake system 14 to regulate airflow into the engine 12. The ECM 30 controls the fuel system 16 to regulate the amount and timing of fuel injection. The ECM 30 controls the ignition system 18 to control spark timing. The ECM 30 may also control one or more other engine actuators, such as intake and exhaust valve actuators, one or more boost devices, an exhaust gas recirculation (ERG) valve, and other types of engine actuators.

The ECM 30 also communicates with various sensors 32 associated with the engine 12. For example only, the sensors 32 may include a mass air flow (MAF) sensor, a manifold air pressure (MAP) sensor, a crankshaft position sensor, an intake air temperature sensor, an oil temperature sensor, a coolant temperature sensor, and other suitable sensors.

The ECM 30 also communicates with exhaust gas oxygen (EGO) sensors associated with the exhaust system 20. For example only, the ECM 30 communicates with an upstream EGO sensor (US EGO sensor) 38, a downstream EGO sensor (DS EGO sensor) 40, and/or one or more other sensors associated with the exhaust system 20. The US EGO sensor 38 is located upstream of the catalyst 28. The DS EGO sensor 40 is located downstream of the catalyst 28.

The US and DS EGO sensors 38 and 40 measure an amount of oxygen in the exhaust at their respective locations and generate an EGO signal based on the amounts of oxygen. For example only, the US EGO sensor 38 generates an upstream EGO (US EGO) signal based on the amount of oxygen upstream of the catalyst 28. The DS EGO sensor 40 generates a downstream EGO (DS EGO) signal based on the amount of oxygen downstream of the catalyst 28.

The US and DS EGO sensors 38 and 40 each include a universal EGO (UEGO) sensor. A UEGO sensor may also referred to as a wide band oxygen sensor, a wide range oxygen sensor, wide range air/fuel sensor, etc. A switching EGO sensor may switch an EGO signal between a low voltage (e.g., approximately 0.1 Volts) and a high voltage (e.g., approximately 0.8 Volts) when the oxygen concentration is lean and rich, respectively. In contrast with switching EGO sensors, a UEGO sensor provides measurements (e.g., in voltage) between rich and lean, inclusive.

Figure 2:
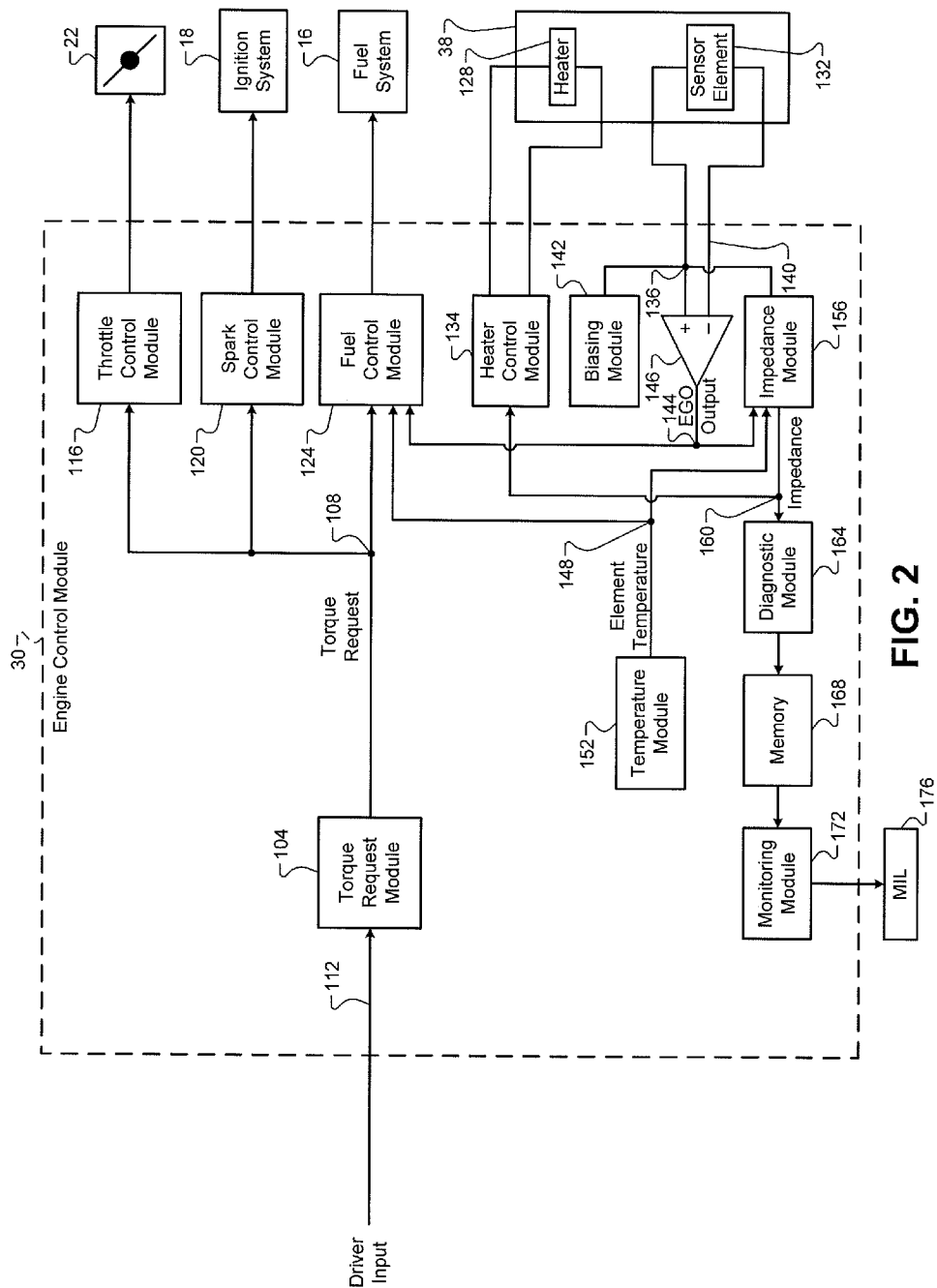
FIG. 2 is a functional block diagram of an example engine control module according to the present disclosure.

Referring now to FIG. 2, a functional block diagram of an example implementation of the ECM 30 is presented. A torque request module 104 may determine a torque request 108 based on one or more driver inputs 112, such as an accelerator pedal position, a brake pedal position, a cruise control input, and/or one or more other suitable driver inputs. The torque request module 104 may determine the torque request 108 additionally or alternatively based on one or more other torque requests, such as torque requests generated by the ECM 30 and/or torque requests received from other modules of the vehicle, such as a transmission control module, a hybrid control module, a chassis control module, etc.

One or more engine actuators may be controlled based on the torque request 108 and/or one or more other parameters. For example, a throttle control module 116 may determine a target throttle opening based on the torque request 108 and control the throttle valve 22 based on the target throttle opening. A spark control module 120 may determine a target spark timing based on the torque request 108 and control the ignition system 18 based on the target spark timing.

A fuel control module 124 may determine one or more target fueling parameters based on the torque request 108 and control the fuel system 16 based on the target fueling parameters. For example, the target fueling parameters may include a target fuel injection amount, number of fuel injections for injecting the target amount, and timing for each of the injections. While only the throttle valve 22, the fuel system 16, and the ignition system 18 are shown and discussed as being controlled based on the torque request 108, one or more other engine actuators may also be controlled based on the torque request 108.

The US EGO sensor 38 includes a heater 128 and a sensor element 132. For example only, the heater 128 may be a resistive heater. A heater control module 134 controls operation of the heater 128. For example, the heater control module 134 may control current flow through the heater 128 to warm the sensor element 132 to greater than a predetermined temperature and to maintain the sensor element 132 within a predetermined temperature range. Measurements from the sensor element 132 may be reliable at temperatures greater than the predetermined temperature.

First and second electrical connectors 136 and 140 are connected to the sensor element 132. A biasing module 142 applies a predetermined bias voltage (relative to a ground reference potential) to the sensor element 132 via the first electrical connector 136. For example only, the predetermined bias voltage may be approximately 0.45 Volts (V) or another suitable value that is within a predetermined range of possible outputs of the US EGO sensor 38. For example only, the predetermined range may be approximately 0.1 V-approximately 0.8 V or another suitable range.

Impedance of the sensor element 132 varies based on temperature. An output module 146 includes first and second inputs that are connected to the first and second electrical connectors 136 and 140, respectively. The output module 146 generates an EGO output voltage 144 based on voltages at the first and second inputs (relative to the ground reference potential). For example only, the output module 146 may include a differential amplifier and generate the EGO output voltage 144 based on a difference between the voltages at the first and second inputs.

When an element temperature 148 is less than the predetermined temperature, the fuel control module 124 may determine the target fuel injection amount independently of the EGO output voltage 144. The element temperature 148 corresponds to a temperature of the sensor element 132. The fuel control module 124 may determine the target fuel injection amount based on the EGO output voltage 144 when the element temperature 148 is greater than the predetermined temperature. For example only, the fuel control module 124 may determine a fueling correction based on the EGO output voltage 144 and an expected value of the EGO output voltage 144 and may determine the target fuel injection amount based on the fueling correction. More specifically, the fuel control module 124 may use the EGO output voltage 144 to control the target fuel injection amount in closed loop.

A temperature module 152 may estimate the element temperature 148. For example, the temperature module 152 may estimate the element temperature 148 based on a resistance of the heater 128, which may be measured by the heater control module 134. Additionally or alternatively, the temperature module 152 may estimate the element temperature 148 based on a period that the engine 12 has been running and/or based on a total (cumulative) mass of air drawn into the engine 12 since the engine 12 was started.

When one or more enabling conditions are satisfied, an impedance module 156 determines an impedance 160 of the sensor element 132. The enabling condition(s) may be satisfied, for example, when the element temperature 148 is greater than a predetermined temperature, when the period that the engine 12 has been running is greater than a predetermined period, and/or when the total mass of air drawn into the engine 12 is greater than a predetermined mass. Additionally or alternatively, the enabling conditions may be satisfied when one or more other conditions are present that indicate that the EGO output voltage 144 is reliable.

The impedance module 156 determines the impedance 160 based on a response of the sensor element 132 to a predetermined current pulse. For example, the impedance module 156 may determine a first value of the EGO output voltage 144 before the predetermined current pulse is generated. A predetermined period after the predetermined current pulse begins, the impedance module 156 may determine a second value of the EGO output voltage 144. The impedance module 156 determines the impedance 160 based on the first and second values and a magnitude of the predetermined current pulse. For example, the impedance module 156 may determine the impedance 160 using the equation:

$$Z = \frac{V2 - V1}{I},$$

where Z is the impedance 160, V2 is the second value of the EGO output voltage 144, V1 is the first value of the EGO output voltage 144, and I is the magnitude of the predetermined current pulse.

The impedance module 156 may provide the predetermined current pulse to the sensor element 132 (e.g., via the first electrical connector 136). The predetermined period may be calibratable and may be set based on an estimated period for the EGO output voltage 144 to stabilize after the predetermined current pulse begins. For example only, the predetermined period may be approximately 3 milliseconds (ms) or another suitable period. The magnitude of the predetermined current pulse and the duration of the predetermined current pulse may also be calibratable. The duration of the predetermined current pulse is greater than the predetermined period and may be set, for example, to approximately 10 ms or another suitable period. The magnitude of the predetermined current pulse may be set, for example, to approximately 0.5 milliamps (mA) or another suitable value. The magnitude of the predetermined current pulse may be set such that the EGO output voltage 144 will remain less than an upper limit of the predetermined range of outputs of the US EGO sensor 38.

A diagnostic module 164 determines whether a fault associated with the US EGO sensor 38 is present based on the impedance 160. The fault may be, for example, within the US EGO sensor 38 or a component that is electrically connected to the US EGO sensor 38.

For example only, the diagnostic module 164 may determine that an open circuit fault is associated with the US EGO sensor 38 when the impedance 160 is greater than a first predetermined value. The diagnostic module 164 may determine that a short-to-ground fault is associated with the US EGO sensor 38 when the impedance 160 is less than a second predetermined value. The diagnostic module may determine that a short-to-power fault is associated with the US EGO sensor 38 when the impedance 160 is greater than a third predetermined value. The first and third predetermined values are greater than the second predetermined value.

In various implementations, the diagnostic module 164 may determine that a fault is associated with the US EGO sensor 38 when the impedance 160 is greater or less than the corresponding predetermined value for at least X out of the last Y of the predetermined current pulses. X and Y are integers greater than zero, and X is less than or equal to Y.

A bias voltage that is greater than the predetermined range of possible outputs of the US EGO sensor 38 (e.g., greater than 1 V, such as approximately 1.9 V) could be used. In such a case, faults associated with the US EGO sensor 38 could be diagnosed based on comparisons of the EGO output voltage 144 with the bias voltage and/or the ground reference potential.

However, use of a bias voltage that is greater than the predetermined range may cause the fuel control module 124 to lean fueling of the engine 12 before a fault is diagnosed due to the bias voltage providing the appearance of (fuel) rich exhaust. The lean fueling may decrease drivability of the vehicle, such as cause an observable decrease in engine speed.

The use of a bias voltage that is within the predetermined range enables faster and more reliable diagnosis that a fault is associated with the US EGO sensor 38. Additionally, during a period before such a fault is diagnosed, a bias voltage that is within the predetermined range will not cause the fuel control module 124 to adjust (lean or richen) fueling of the engine 12. Additionally, the use of a bias voltage that is within the predetermined range improves a light off time of the US EGO sensor 38 because of the lower bias voltage to overcome. The diagnoses of whether a fault is associated with the US EGO sensor 38 can also be run more continuously including periods when fueling is being controlled in open-loop as the diagnoses will not be affected by how fueling is being controlled.

The diagnostic module 164 generates an indicator when a fault is associated with the US EGO sensor 38. For example, the diagnostic module 164 may set a predetermined diagnostic trouble code (DTC) associated with the fault in memory 168 when the fault is present. The diagnostic module 164 may, for example, set a first predetermined DTC to the active state when an open circuit fault is associated with the US EGO sensor 38. The diagnostic module 164 may set a second predetermined DTC to the active state when a short-to-ground fault is associated with the US EGO sensor 38. The diagnostic module 164 may set a third predetermined DTC to the active state when a short-to-power fault is associated with the US EGO sensor 38.

A monitoring module 172 may monitor the memory 168 and take one or more remedial actions when a fault associated with the US EGO sensor 38 is determined to be present. For example, the monitoring module 172 may illuminate a malfunction indicator lamp (MIL) 176. One or more other remedial actions may additionally be taken when a fault associated with the US EGO sensor 38 is diagnosed. While the impedance determination and fault diagnosis have been discussed in conjunction with the US EGO sensor 38, the impedance determination and fault diagnosis are also applicable to the DS EGO sensor 40 and other EGO sensors.

Figure 3:
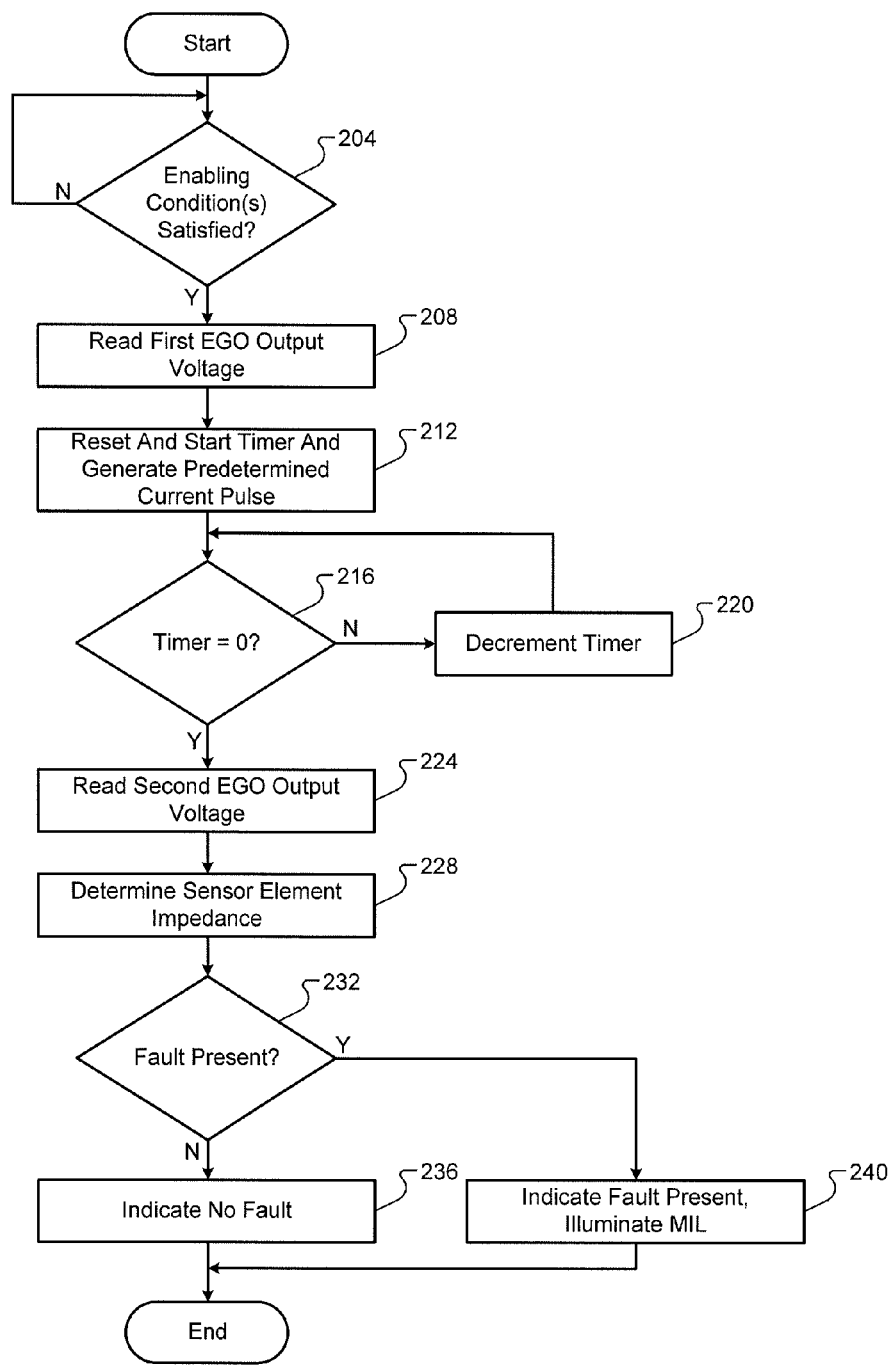
FIG. 3 is a flowchart depicting an example method of measuring impedance of a sensing element of an oxygen sensor and diagnosing a fault associated with an oxygen sensor based on the impedance.

Referring now to FIG. 3, a flowchart depicting an example method of measuring impedance of a sensing element of an oxygen sensor and diagnosing a fault associated with the oxygen sensor based on the impedance. Control may begin with 204 where the impedance module 156 may determine whether the one or more enabling conditions are satisfied. If 204 is true, control may continue with 208. If 204 is false, control may remain at 204.

At 208, the impedance module 156 may determine the first value of the EGO output voltage 144. The impedance module 156 may reset a timer based on the predetermined period and begin generating the predetermined current pulse at 212. At 216, the impedance module 156 may determine whether the timer has reached zero. If 216 is false, the impedance module 156 may decrement the timer at 220, continue generating the predetermined current pulse, and return to 216. If 216 is true, control may continue with 224. While resetting the timer based on the predetermined period, decrementing the timer, and determining whether the timer has reached zero have been discussed, resetting the timer to zero, incrementing the timer, and determining whether the timer is greater than or equal to the predetermined period may be used.

At 224, the impedance module 156 determines the second value of the EGO output voltage 144. The impedance module 156 determines the impedance 160 of the sensor element 132 at 228. The impedance module 156 determines the impedance 160 based on the first and second values of the EGO output voltage 144 and the magnitude of the predetermined current pulse. For example, the impedance module 156 may determine the impedance 160 using the equation:

$$Z = \frac{V2 - V1}{I},$$

where Z is the impedance 160, V2 is the second value of the EGO output voltage 144, V1 is the first value of the EGO output voltage 144, and I is the magnitude of the predetermined current pulse.

At 232, the diagnostic module 164 determines whether a fault associated with the US EGO sensor 38 is present. If 232 is false, the diagnostic module 164 may indicate that the fault is not present at 236, and control may end. If 232 is true, control may continue with 240.

For example only, the diagnostic module 164 may determine that an open circuit fault is associated with the US EGO sensor 38 when the impedance 160 is greater than a first predetermined value. The diagnostic module 164 may determine that a short-to-ground fault is associated with the US EGO sensor 38 when the impedance 160 is less than a second predetermined value. The diagnostic module 164 may determine that a short-to-power fault is associated with the US EGO sensor 38 when the impedance 160 is greater than a third predetermined value. The first and third predetermined values are greater than the second predetermined value.

In various implementations, the diagnostic module 164 may determine that a fault is associated with the US EGO sensor 38 when the impedance 160 is greater or less than the corresponding predetermined value for at least X out of the last Y of the predetermined current pulses. X and Y are integers greater than zero, and X is less than or equal to Y. The diagnostic module 164 may indicate that the fault is present and the monitoring module 172 may illuminate the MIL 176 at 240, and control may end. While control is shown and discussed as ending, FIG. 3 may be illustrative of one control loop and a control loop may be executed every predetermined period.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. As used herein, the phrase at least one of A, B, and C should be construed to mean a logical (A or B or C), using a non-exclusive logical OR. It should be understood that one or more steps within a method may be executed in different order (or concurrently) without altering the principles of the present disclosure.

In this application, including the definitions below, the term module may be replaced with the term circuit. The term module may refer to, be part of, or include an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor (shared, dedicated, or group) that executes code; memory (shared, dedicated, or group) that stores code executed by a processor; other suitable hardware components that provide the described functionality; or a combination of some or all of the above, such as in a system-on-chip.

The term code, as used above, may include software, firmware, and/or microcode, and may refer to programs, routines, functions, classes, and/or objects. The term shared processor encompasses a single processor that executes some or all code from multiple modules. The term group processor encompasses a processor that, in combination with additional processors, executes some or all code from one or more modules. The term shared memory encompasses a single memory that stores some or all code from multiple modules. The term group memory encompasses a memory that, in combination with additional memories, stores some or all code from one or more modules. The term memory may be a subset of the term computer-readable medium. The term computer-readable medium does not encompass transitory electrical and electromagnetic signals propagating through a medium, and may therefore be considered tangible and non-transitory. Non-limiting examples of a non-transitory tangible computer readable medium include nonvolatile memory, volatile memory, magnetic storage, and optical storage.

The apparatuses and methods described in this application may be partially or fully implemented by one or more computer programs executed by one or more processors. The computer programs include processor-executable instructions that are stored on at least one non-transitory tangible computer readable medium. The computer programs may also include and/or rely on stored data.

What is claimed is:

1. A diagnostic system of a vehicle, comprising:
an impedance module that, in response to a determination that a temperature of a sensing element of an exhaust gas oxygen sensor is greater than a predetermined temperature:
changes current through the sensing element of the exhaust gas oxygen sensor; and
determines an impedance of the sensing element of the exhaust gas oxygen sensor based on a response of the sensing element to the change in current through the sensing element;
a diagnostic module that selectively diagnoses an open circuit fault associated with the exhaust gas oxygen sensor when the impedance of the sensing element is greater than a first predetermined value, that diagnoses a short-to-ground fault associated with the exhaust gas oxygen sensor when the impedance of the sensing element is less than a second predetermined value, and that diagnoses a short-to-power fault associated with the exhaust gas oxygen sensor when the impedance of the sensing element is greater than a third predetermined value, wherein the first and third predetermined values are greater than the second predetermined value; and
a monitoring module that illuminates a lamp when at least one of the open circuit fault, the short-to-ground fault, and the short-to-power fault is diagnosed.

2. An engine control system comprising:
the diagnostic system of claim 1; and
a fuel control module that selectively adjusts fueling of an engine based on an output of the exhaust gas oxygen sensor.

3. The diagnostic system of claim 1 wherein the impedance module determines the impedance of the sensing element based on the change in current through the sensing element, a first value of a voltage output of the sensing element before the change, a second value of the voltage output of the sensing element after the change.

4. The diagnostic system of claim 3 wherein the impedance module determines the impedance of the sensing element based on the change and a difference between the first and second values.

5. The diagnostic system of claim 3 wherein the impedance module sets a third value equal to the second value minus the first value and determines the impedance of the sensing element based on the third value divided by the change.

6. The diagnostic system of claim 1 wherein:
the impedance module determines Y values of the impedance of the sensing element based on Y responses of the sensing element to Y changes in current through the sensing element, respectively;
Y is an integer greater than one; and
the diagnostic module selectively diagnoses the open circuit fault, the short-to-ground fault, and the short-to-power fault based on the Y values of the impedance.

7. The diagnostic system of claim 6 wherein:
the diagnostic module diagnoses the open circuit fault when at least X out of the Y values of the impedance are greater than the first predetermined value, diagnoses the short-to-ground fault when at least X out of the Y values of the impedance are less than the second predetermined value, and diagnoses the short-to-power fault when at least X out of the Y values of the impedance are greater than the third predetermined value;
X is an integer greater than zero; and
X is one of less than or equal to Y.

8. A diagnostic method for a vehicle, comprising:
in response to a determination that a temperature of a sensing element of an exhaust gas oxygen sensor is greater than a predetermined temperature:
changing current through the sensing element of the exhaust gas oxygen sensor; and
determining an impedance of the sensing element of the exhaust gas oxygen sensor based on a response of the sensing element to the change in current through the sensing element;
selectively diagnosing an open circuit fault associated with the exhaust gas oxygen sensor when the impedance of the sensing element is greater than a first predetermined value;
selectively diagnosing a short-to-ground fault associated with the exhaust gas oxygen sensor when the impedance of the sensing element is less than a second predetermined value;
selectively diagnosing a short-to-power fault associated with the exhaust gas oxygen sensor when the impedance of the sensing element is greater than a third predetermined value,
wherein the first and third predetermined values are greater than the second predetermined value; and
illuminating a lamp when at least one of the open circuit fault, the short-to-ground fault, and the short-to-power fault is diagnosed.

9. The diagnostic method of claim 8 further comprising selectively adjusting fueling of an engine based on an output of the exhaust gas oxygen sensor.

10. The diagnostic method of claim 8 further comprising determining the impedance of the sensing element based on the change in current through the sensing element, a first value of a voltage output of the sensing element before the change, a second value of the voltage output of the sensing element after the change.

11. The diagnostic method of claim 10 further comprising determining the impedance of the sensing element based on the change and a difference between the first and second values.

12. The diagnostic method of claim 10 further comprising:
setting a third value equal to the second value minus the first value; and
determining the impedance of the sensing element based on the third value divided by the change.

13. The diagnostic method of claim 8 further comprising:
determining Y values of the impedance of the sensing element based on Y responses of the sensing element to Y changes in current through the sensing element, respectively,
wherein Y is an integer greater than one; and
selectively diagnosing the open circuit fault, the short-to-ground fault, and the short-to-power fault based on the Y values of the impedance.

14. The diagnostic method of claim 13 further comprising:
diagnosing the open circuit fault when at least X out of the Y values of the impedance are greater than the first predetermined value;
diagnosing the short-to-ground fault when at least X out of the Y values of the impedance are less than the second predetermined value; and
diagnosing the short-to-power fault when at least X out of the Y values of the impedance are greater than the third predetermined value,
wherein X is an integer greater than zero, and
wherein X is one of less than or equal to Y.

15. The diagnostic system of claim 1 further comprising a biasing module that applies a predetermined bias voltage to the sensing element of the exhaust gas oxygen sensor,
wherein the predetermined bias voltage is within a predetermined range of possible output voltages of the exhaust gas oxygen sensor.

16. The diagnostic method of claim 8 further comprising applying a predetermined bias voltage to the sensing element of the exhaust gas oxygen sensor,
wherein the predetermined bias voltage is within a predetermined range of possible output voltages of the exhaust gas oxygen sensor.

\* \* \* \* \*